US006911829B2

(12) United States Patent
Hilliard et al.

(10) Patent No.: US 6,911,829 B2
(45) Date of Patent: Jun. 28, 2005

(54) INDUCTIVE SIGNATURE MEASUREMENT CIRCUIT

(75) Inventors: Steven R. Hilliard, Knoxville, TN (US); Michael J. Roberts, Knoxville, TN (US); Geoffrey C. Yerem, Knoxville, TN (US)

(73) Assignee: Inductive Signature Technologies, Inc., Knoxville, TN (US)

( * ) Notice: Subject to any disclaimer, the term of this patent is extended or adjusted under 35 U.S.C. 154(b) by 0 days.

(21) Appl. No.: 10/614,384

(22) Filed: Jul. 7, 2003

(65) Prior Publication Data

US 2004/0095148 A1 May 20, 2004

Related U.S. Application Data

(63) Continuation of application No. 10/184,768, filed on Jun. 28, 2002, now Pat. No. 6,590,400.

(60) Provisional application No. 60/301,778, filed on Jun. 29, 2001.

(51) Int. Cl.[7] ........................ G01R 27/28; G01R 31/06; H03D 1/00

(52) U.S. Cl. .................... 324/654; 324/546; 324/76.75; 329/361

(58) Field of Search ............................ 324/654, 207.15, 324/207.16, 234, 236, 239, 327, 613, 655, 76.75, 258; 331/65, 167, 117 R, 74; 329/316, 347, 358, 361

(56) References Cited

U.S. PATENT DOCUMENTS

| | | | | | |
|---|---|---|---|---|---|
| 3,587,040 | A | | 6/1971 | Fathauer | 340/938 |
| 3,873,964 | A | | 3/1975 | Potter | 340/939 |
| 4,263,549 | A | * | 4/1981 | Toppeto | 324/127 |
| 4,276,539 | A | | 6/1981 | Eshraghian et al. | 340/939 |
| 4,296,401 | A | | 10/1981 | Duley | 340/938 |
| 4,472,706 | A | | 9/1984 | Hodge et al. | 340/941 |
| 4,568,937 | A | * | 2/1986 | Clark | 340/939 |
| 4,843,259 | A | | 6/1989 | Weisshaupt | 327/510 |
| 4,873,494 | A | | 10/1989 | Jefferis | 331/65 |
| 5,153,525 | A | | 10/1992 | Hoekman et al. | 324/655 |
| 5,361,064 | A | | 11/1994 | Hamer et al. | 340/939 |
| 5,455,768 | A | | 10/1995 | Johnson et al. | 702/142 |
| 5,469,156 | A | * | 11/1995 | Kogure | 340/870.38 |
| 5,491,475 | A | | 2/1996 | Rouse et al. | 340/933 |
| 5,523,753 | A | | 6/1996 | Fedde et al. | 340/933 |
| 5,592,097 | A | * | 1/1997 | Shimizu et al. | 324/546 |
| 5,621,314 | A | * | 4/1997 | Beck et al. | 324/179 |
| 5,844,502 | A | | 12/1998 | Perez et al. | 340/941 |
| 6,104,199 | A | * | 8/2000 | Sako | 324/546 |
| 6,337,602 | B2 | | 1/2002 | Hilliard et al. | 331/65 |

* cited by examiner

*Primary Examiner*—Anjan K. Deb
(74) *Attorney, Agent, or Firm*—Pitts & Brittian, P.C.

(57) ABSTRACT

An apparatus for measuring the inductance of a wire-loop with noise-cancellation, auto-calibration and wireless communication features, or detector circuit. The apparatus measures the effective change in inductance induced in a wire-loop as a vehicle passes over the wire-loop to produce an inductive signature corresponding to a vehicle.

37 Claims, 7 Drawing Sheets

INDUCTIVE SIGNATURE MEASUREMENT CIRCUIT

CROSS-REFERENCE TO RELATED APPLICATIONS

This application is a continuation of application Ser. No. 10/184,768, filed Jun. 28, 2002, now U.S. Pat. No. 6,590, 400, which claims the benefit of U.S. Provisional Application No. 60/301,778, filed Jun. 29, 2001.

STATEMENT REGARDING FEDERALLY SPONSORED RESEARCH OR DEVELOPMENT

Not Applicable.

BACKGROUND OF THE INVENTION

1. Field of Invention

The present invention relates to an apparatus and method for the measurement of inductance. More precisely the present invention relates to an apparatus and method for the measurement of inductance of a wire-loop sensor in the presence of a vehicle moving in a traffic lane.

2. Description of the Related Art

It is well known in the prior art to measure the inductance of a wire-loop, which is part of the frequency determining circuit of an LCR oscillator, using frequency-counting techniques. Typically, the number of zero-crossings per time increment of the voltage across the terminals of the LCR capacitor, C, is counted. Because the frequency of the LCR oscillator is inversely proportional to the square root of the inductance, L, of the LCR circuit, changes in the inductance of the wire-loop are reflected in changes of the number of zero-crossings counted per time increment. The Class-C wire-loop oscillator described in U.S. Pat. No. 3,873,964 issued to Thomas R. Potter on Mar. 25, 1975 is typical of LCR oscillators used in the prior-art.

Another problem associated with the measurement of inductance in a wire-loop is crosstalk.

BRIEF SUMMARY OF THE INVENTION

An apparatus for measuring the inductance of a wire-loop with noise-cancellation, auto-calibration and wireless communication features, or detector circuit is shown and described. The apparatus measures the effective change in inductance induced in a wire-loop as a vehicle passes over the wire-loop to produce an inductive signature corresponding to a vehicle.

Generally, the detector circuit includes at least one wire-loop sensor connected to a resistance-capacitance (RC) network to form a fixed-frequency RLC driver circuit. The RLC circuit is coupled to a variable-gain differential preamplifier that buffers and amplifies the differential output of the RLC circuit. The preamplifier is coupled to a demodulation circuit, which mixes the component outputs of the RLC circuit with the output of a demodulation oscillator and generates a demodulated signal corresponding to the envelope of the combined RLC waveform. The demodulation circuit feeds a low-pass filter that removes out-of-band noise and produces a filtered signal. A variable-gain amplification stage amplifies the filtered signal. In order to obtain sufficient amplification and maintain the amplified signal within the bounds of a single power supply, a signal conditioning stage removes a DC offset, which is produced by a DC offset generator, from the filtered signal prior to the amplification stage. An analog-to-digital converter (ADC) samples the amplified output to produce a digitized output of the measured inductance, which represents the inductive signature of the vehicle. When used with wire-loop sensors of appropriate design, the repeatable inductive signatures produced by the detector circuit provide information about the speed and volume of vehicular traffic, the occupancy of the wire-loops sensors and allows classification and re-identification with greater precision and accuracy than is available with conventional detector circuitry. The ability to classify with high precision and accuracy and to re-identify vehicles crossing other wire-loop sensors within a vehicle detection system network allows the determination of travel time and origin/destination information, as well as traffic safety information, such as collision warnings and accident avoidance information.

The operation of the detector circuit of the present invention resembles a frequency modulation-to-amplitude modulation (FM-to-AM) detector circuit, also known as a slope detector circuit, which is used in radio communications. In the detector circuit of the present invention, the frequency of the input signal remains fixed and the resonant frequency of the tuned RLC circuit changes. The change in resonance results from variations in the inductance of the wire-loop, which modulates the amplitude and the phase of the fixed-frequency input. In other words, the input signal is a carrier that is modulated by the vehicle signature.

One method for detecting a vehicle using the detector circuit of the present invention involves monitoring the output voltage of the detector circuit, as compared to frequency counting techniques common in the prior art. An examination of the envelope of the amplitude-modulated waveform provides the desired output voltage information.

Demodulating the amplitude-modulated (AM) waveform produces the envelope of the waveform. When the carrier frequency lies near the resonant frequency of the RLC network, the RLC network attenuates the input signal at the harmonics of the demodulation square wave and also the undesired effects of mixing with a square wave are minimal. A low-pass filter applied to the envelope rejects signals outside of the baseband, which now contains the vehicle signature. The fixed-frequency input is set to a frequency on the skirt of the RLC transfer function on either side of the resonant frequency. This maximizes the amplitude of the resulting inductive signature. The skirt is also fairly linear. Placing the input frequency on one side results in relative signatures that are substantially the negative of signatures produced on the other side of the skirt.

Inductance measurement circuits are susceptible to two types of noise. One is common-mode noise and the other is differential noise, both of which are induced in the wire-loop from ambient sources, such as high voltage lines. The present invention incorporates a number of noise rejection features, which improves the overall performance and efficiency of the detector circuit. By design, the detector circuit of the present invention is double-ended and balanced. Because the signal of interest is differential, subtracting the signal of one leg of the detector circuit from the signal of the other leg rejects common-mode noise. The optional coupling transformer rejects common-mode signals from the wire-loop. In addition, the differential input of the ADC provides another opportunity for common-mode rejection.

The synchronous demodulator of the present invention takes advantage of the differential output from the RLC circuit. Because the output on one leg of the RLC circuit is 180 degrees out of phase with the output on the other leg, switching between the two legs using the switches of the synchronous demodulator is similar to inverting the output signal of the RLC circuit at every other half cycle of the demodulator frequency. This maintains single-supply operation and does not require a multiplication or inversion operation. Overall, this method modulates differential signals while passing common-mode signals. Differential signals outside of the frequency band of interest are rejected while all differential signals inside of the frequency band of interest are kept. The frequency band of interest is selected to be a band that contains a minimum of unwanted signals, for example power line interference, or a band that contains signals that are controllable, such as crosstalk between loop sensors.

An inductive wire-loop is also susceptible to crosstalk. By controlling the frequency of the excitation sources of two or more cross-talking wire-loops to a high precision and with a modicum of coordination, the beat frequency caused by crosstalk between the wire-loops is controlled. Each detector circuit is provided with a unique carrier frequency and distinct frequency band within which to operate. The carrier frequencies need to be spaced far enough apart in order to give enough bandwidth for the signature's signal. The exact amount of separation between carrier frequencies depends on the number of detector circuits operating in close proximity. The bandwidth required for a signature is mainly a function of vehicle speed, vehicle features and loop geometry.

Inductive loops that are in close proximity to each other are magnetically coupled. One consequence of this coupling is that if one loop is driven by a time-varying voltage causing a time-varying current to flow, part of the magnetic field created by that current will intersect the other loop causing a time-varying current to flow in the other loop. This is a mechanism by which information can be transmitted by one loop and received by another, without requiring the detector circuits to be otherwise physically linked.

The signal created in the receiving loop by the magnetic coupling will be added to the driving signal of the receiving loop that is used to detect vehicle signatures. If the frequency of the communication signal generated by the transmitting loop is different from the frequency of the receiving loop's own driving voltage and if the bandwidth of the data transmission is low enough, when the two signals are added in the receiving loop, they can be later separated by a processor employing signal processing techniques, and both loops can detect vehicle signatures while simultaneously sending and receiving data.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

An apparatus for measuring the inductance of a wire-loop with noise-cancellation, auto-calibration and wireless communication features, or detector circuit, is illustrated generally at 10 in the figures. The apparatus 10 measures the effective change in inductance induced in a wire-loop as a vehicle passes over the wire-loop to produce an inductive signature corresponding to a vehicle.

Figure 1:
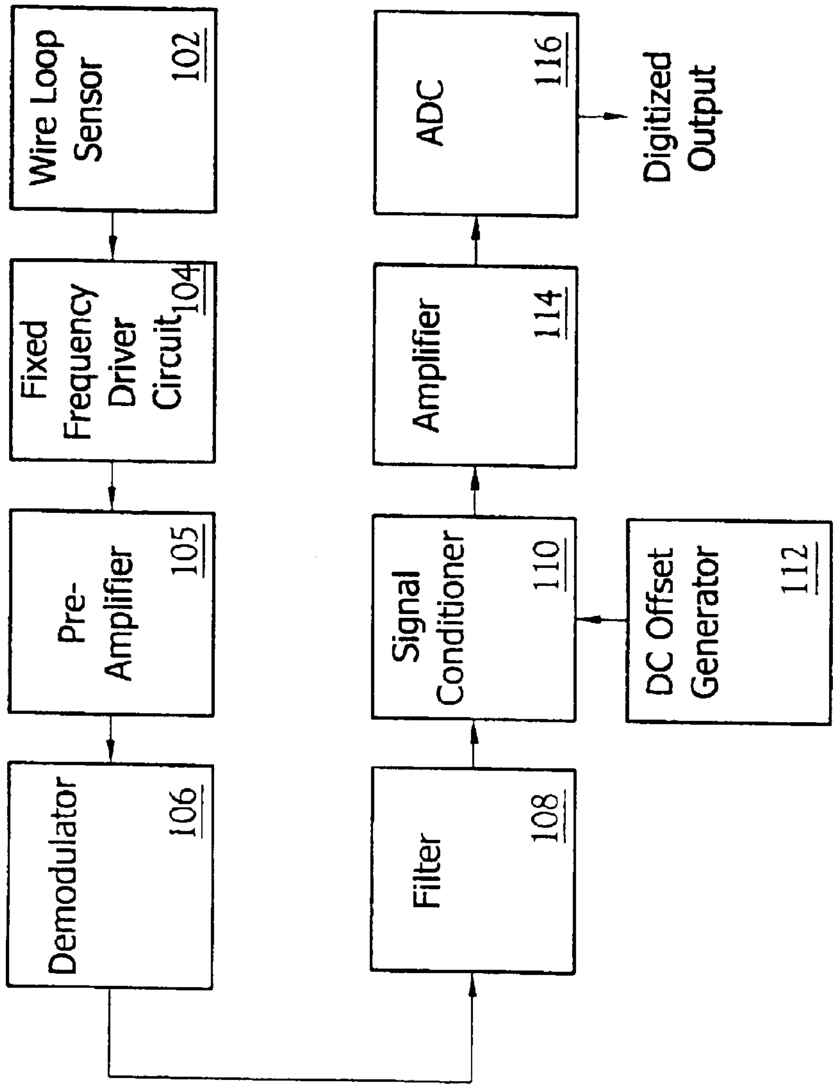
FIG. 1 is a block diagram of the detector circuit of the present invention.

FIG. 1 is a block diagram of the detector circuit 10 of the present invention. Generally, the detector circuit 10 includes at least one wire-loop sensor 102 connected to a resistance-capacitance (RC) network to form a fixed-frequency RLC driver circuit 104. The RLC circuit 104 is coupled to a variable-gain differential preamplifier/buffer 105 that buffers and amplifies the differential output of the RLC driver circuit 104. The output of the preamplifier 105 feeds a demodulation circuit 106, which mixes the component outputs of the RLC circuit 104 with the output of a demodulation oscillator and generates a demodulated signal corresponding to the envelope of the combined RLC waveform. The demodulation circuit 106 feeds a filter 108 that removes out-of-band noise (noise which has a higher or lower frequency than the baseband frequency) and produces a filtered signal. In one embodiment, the demodulation circuit 106 is a synchronous demodulator that is on the same frequency as the RLC driver circuit 104. Those skilled in the art will recognize that it is typical to use the same frequency, although other frequencies can be used. Further, it will be recognized by those skilled in the art that the phase shift between the demodulation circuit and the RLC driver circuit can vary. Because the signal of interest is typically small in relation to the envelope, the variable-gain amplification stage 114 amplifies the filtered signal. In order to obtain sufficient amplification and maintain the amplified signal within the bounds of a single power supply, a signal conditioning stage 110 removes a DC offset, which is produced by a DC offset generator 112, from the filtered signal prior to the amplification stage 114. An analog-to-digital converter (ADC) 116 samples the amplified output to produce a digitized output of the measured inductance, which represents the inductive signature of the vehicle. When used with wire-loop sensors of appropriate design, the repeatable inductive signatures produced by the detector circuit provide information about the speed and volume of vehicular traffic, the occupancy of the wire-loops sensors and allows classification and re-identification with greater precision and accuracy than is available with conventional detector circuitry. The ability to classify with high precision and accuracy and to re-identify vehicles crossing other wire-loop sensors within a vehicle detection system network allows the determination of travel time and origin/destination information, as well as traffic safety information, such as collision warnings and accident avoidance information.

Figure 2:
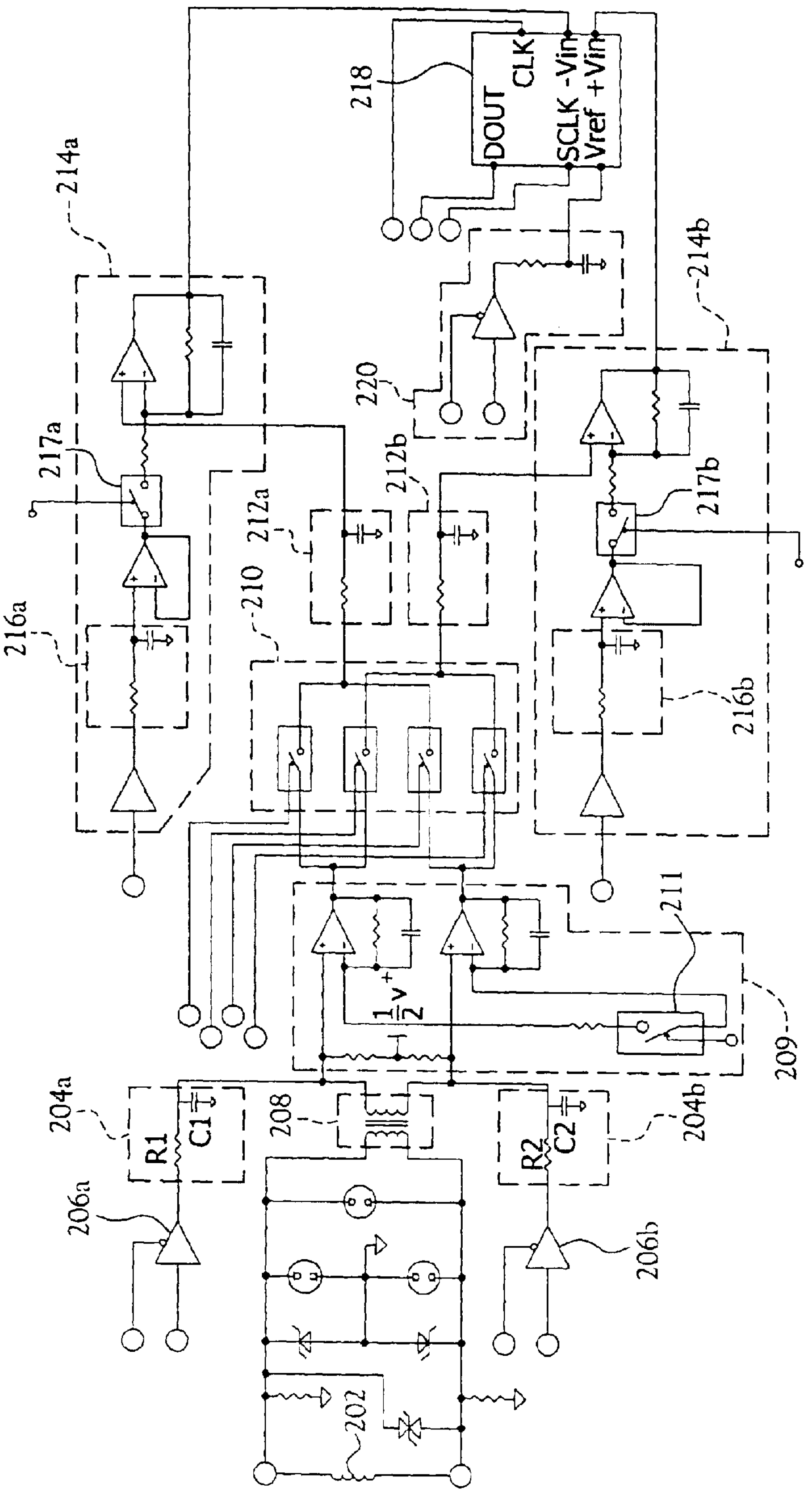
FIG. 2 is a schematic diagram of the detector circuit of the present invention.

FIG. 2 is a schematic illustrating the detector circuit 10 of the present invention in greater detail. The detector circuit 10 drives the inductive loop 202 through two RC networks 204 with two multi-state buffers 206, each of which offer a high or low logic voltage and a high-output-impedance state. In the illustrated embodiment, the multi-state buffers 206 are tri-state buffers. Choosing the resistance and capacitance values so that each RC network 204 has large apparent impedance reduces the amount of power required to drive the detector circuit 10. Controlling the high-impedance state of the tri-state buffer 206 is used to balance the circuit, which effectively modulates the resistances $R_1$ and $R_2$. In one embodiment, the inductive loop is directly coupled to the RC network. In the illustrated embodiment, the inductive loop 202 is coupled to the RC networks 204 through an optional transformer 208, for common-mode noise rejection. Additional optional components visible in the illustrated embodiment include neon lamps, which have no effect on the impedance of the loop 202 during normal operation, and transient voltage suppression diodes, which have a small capacitance that must be considered. Those skilled in the art will recognize that using coupling arrangements, other than a direct connection, for the inductive loop and the RC network present an early opportunity for common-mode noise rejection and may involve subsequent additional processing to compensate. Further, those skilled in the art will recognize that the illustrated additional components can be omitted or other components may be added without departing from the scope and spirit of the present invention.

The voltage across each capacitor $C_1$, $C_2$ is connected to a differential variable-gain preamplifier 209. The preamplifier 209 serves to amplify the differential signal from $C_1$, $C_2$ while common mode signals will pass through with no gain. The switch 211 connected to the gain resistor acts to change the gain of the preamplifier between unity gain and maximum gain. If the switch 211 is modulated at some frequency with a variable duty cycle, the gain can be adjusted continuously. The high-impedance input and low-impedance output act to buffer the RLC network from the synchronous demodulator. Additionally, the low-pass nature of the preamplifier 209 aids in rejecting high-frequency noise.

The output of the preamplifier stage is connected to a RC low-pass filter 212, through a network of four analog switches 210. Each analog switch 210 is either on or off at any particular time. By properly timing the switching of the analog switches 210, the amplitudes and phases of the voltages across the capacitors C1, C2 is measured, through a technique commonly called "synchronous demodulation". Accordingly, the network of analog switches, when properly timed, is referred to as a synchronous demodulator 210.

Because the inductive signature of interest is typically small compared to the amplitude of the signal envelope, the output of each low-pass filter 212 is optionally amplified by a variable-gain differential amplifier stage 214 before being sampled by the ADC 218. The switches 217*a*, 217*b* connected to the gain resistor acts to switch between unity gain and maximum gain. If the switches 217*a*, 217*b* are modulated at some frequency with a variable duty cycle, the gain can be adjusted continuously. By setting the switching frequency sufficiently high and setting it to a "null" of a subsequent digital filter, the switching effects can be removed. In order to obtain sufficient amplification and maintain the amplified signal within the bounds of a single power supply, a dc-offset voltage is subtracted from the signal before the difference is amplified. However, those skilled in the art will recognize that the present circuit will operate adequately without the subtraction of a dc-offset voltage. An RC network 216 in the differential amplifier stage 214, and the buffer feeding it, act as a 1-bit digital-to-analog converter (DAC), which produces an unwanted ripple in the amplified signal in addition to the desired dc offset. By setting the switching frequency input to the buffers and setting the frequency of the ripple to a null of a digital filter, the induced ripple can be subsequently removed. In the illustrated embodiment, the ADC 218 is a delta-sigma ADC, which includes some basic digital signal processing capabilities that allows the ADC to remove the ripple during sampling. Those skilled in the art will recognize that other implementations of a filter to remove the ripple can used.

Figure 3:
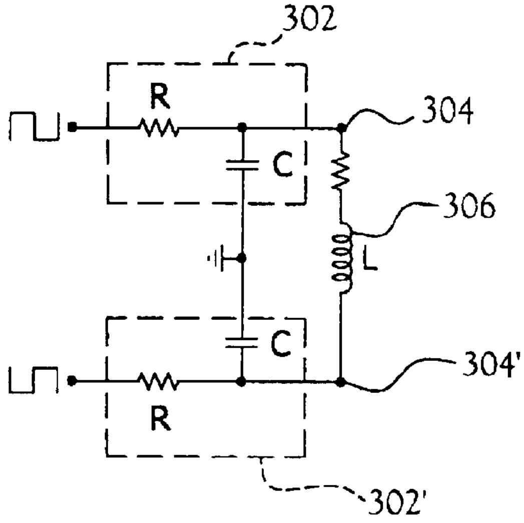
FIG. 3 is a schematic diagram of an equivalent circuit for the RLC circuit of the present invention.

The inductance measurement circuit of the present invention is primarily composed of a resistance, inductance and capacitance (RLC) circuit that forms a resonant or "tuned" circuit. The inductance is substantially inherent in the wire-loop. The resistance and capacitance is substantially part of the detector circuit. The RLC resistance is different from $R_1$ and $R_2$ of the fixed frequency driver circuit. The values of resistance and capacitance, which are typically fixed, are chosen to give a useful range of response for any type of inductive sensor that is connected to the circuit. FIG. 3 is a schematic of an equivalent circuit for the RLC circuit of the present invention. A separate and symmetric RC network 302 is connected to each terminal 304 of the wire-loop 306. This results in a balanced, differential circuit that has excellent noise rejection capabilities.

The detector circuit drives the RLC circuit with a differential, periodic waveform. A sine wave is useful for the driving waveform because it has an infinitely narrow bandwidth and the resulting output will be a sine wave differing only in amplitude and phase. However, the use of a sine wave for the driving waveform requires a more sophisticated frequency generator than some other waveforms. Another choice for the driving waveform is a fixed-frequency square wave because it is simple to generate. While an effective detector circuit 10 can be based upon a square wave, the use of a square wave for the driving waveform brings with it the disadvantage of monotonically decreasing harmonics, which occur at odd multiples (3, 5, 7 . . . etc.) of the fundamental frequency.

Because the transfer function of the RLC circuit attenuates the harmonics of a square wave, the output of the detector circuit approximates a sine wave when the detector circuit is driven with a square wave at a frequency close to the resonant frequency of the RLC circuit. Accordingly, acceptable results are obtained by driving the wire-loop with a square wave having a frequency near the resonant frequency of the RLC circuit.

Figure 4:
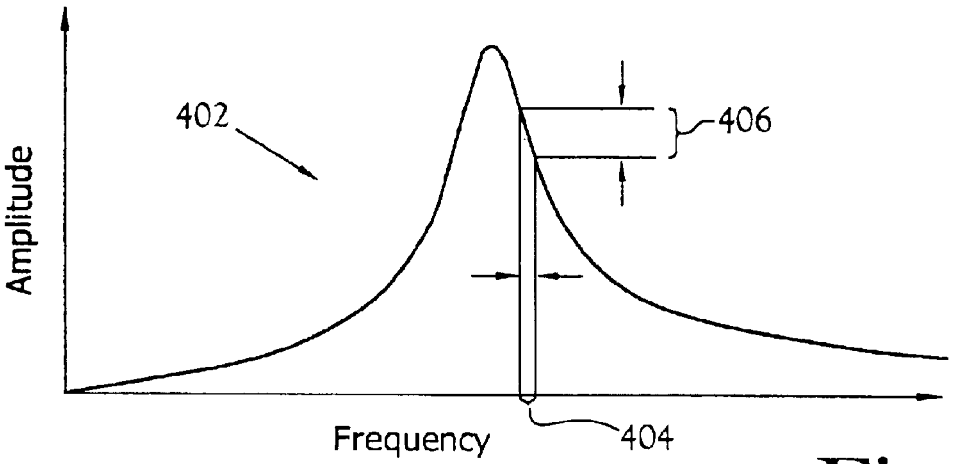
Fig.4 (PRIOR ART)
FIG. 4 is a graph of a frequency response curve for a prior art FM-to-AM slope detector circuit.

The operation of the detector circuit of the present invention resembles a frequency modulation-to-amplitude modulation (FM-to-AM) detector circuit, also known as a slope detector circuit, which is used in radio communications. FIG. 4 illustrates a frequency response curve 402 for the FM-to-AM detector circuit. In the FM-to-AM detector circuit, the FM signal is passed through a tuned circuit where the carrier frequency 404 of the signal coincides with the linear region, or skirt 406 of the tuned circuit. Because the slope of the skirt 406 approximates a line, changes in the frequency 404 of the input signal are transformed proportionately into changes in the amplitude of the output signal.

Figure 5:
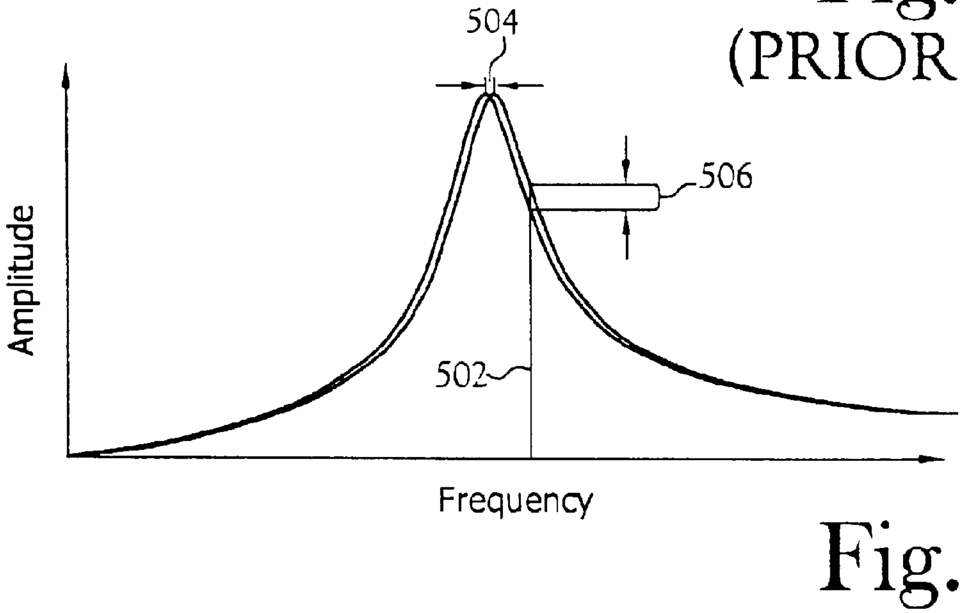
FIG. 5 is a graph of a frequency response curve for the detector circuit of the present invention.

In the detector circuit of the present invention, the frequency 502 of the input signal remains fixed and the resonant frequency 504 of the tuned RLC circuit changes, as illustrated in FIG. 5. The change in resonance 504 results from variations in the inductance of the wire-loop, which modulates the amplitude 506 and the phase of the fixed-frequency input. In other words, the input signal is a carrier that is modulated by the vehicle signature.

One method for detecting a vehicle using the detector circuit of the present invention involves monitoring the output voltage of the detector circuit, as compared to frequency counting techniques common in the prior art. An examination of the envelope of the amplitude-modulated waveform provides the desired output voltage information.

Figure 11:
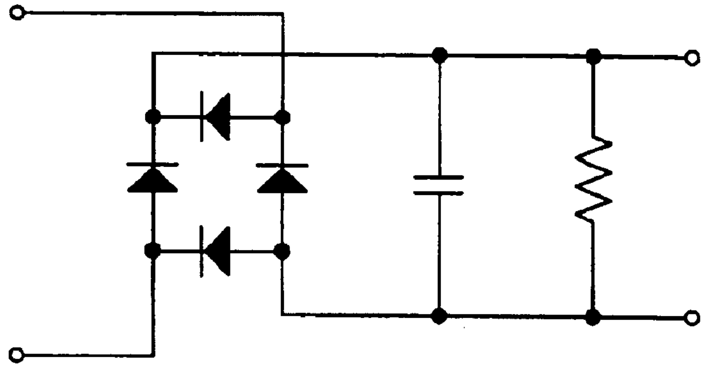
FIG. 11 is a schematic diagram of an implementation of a full-wave bridge rectifier circuit for use in the detector circuit of the present invention.

Demodulating the amplitude-modulated (AM) waveform produces the envelope of the waveform. Those skilled in the art will recognize a number of demodulation techniques that can produce the envelope from the modulated waveform. One approach is to use a synchronous demodulator that multiplies or "mixes" the modulated waveform with a sine wave oscillating at the carrier frequency. Generally, the digital multiplication of another signal by a sine wave is computationally intensive and the analog implementation of sine wave multiplication requires additional circuitry, which can be complex. To minimize the computational requirements and the need for additional circuitry, the illustrated embodiment of the detector circuit uses a switching network for demodulation. The switching network of the present invention effectively achieves the same result as if the modulated signal was mixed with a square wave. When the carrier frequency approximates the resonant frequency of the RLC network, the RLC network attenuates the input signal at the harmonics of the demodulation square wave and the undesired effects of mixing with a square wave are minimal. Those skilled in the art will recognize that demodulation can be accomplished using components other than a synchronous demodulator without departing from the scope and spirit of the present invention. By way of example, a full wave bridge rectifier, as shown in FIG. 11, will effectively demodulate the waveform to produce an envelope.

A low-pass filter applied to the envelope rejects signals outside of the baseband, which now contains the vehicle signature. In the illustrated embodiment, the detector circuit uses a RC low-pass filter 212 in conjunction with the single-pole roll-off of a non-inverting feedback amplifier 214. This basic low-pass filtering is supplemented with digital low-pass filtering of a higher order. In the illustrated embodiment, the delta-sigma ADC serves as a higher order low-pass filter. Further, the preamplifier also adds to the filtering. Those skilled in the art will recognize that other filtering methods can be used without departing from the spirit and scope of the present invention.

One benefit of extracting the envelope of a modulated waveform is that the frequency content of the demodulated vehicle signature is much less than the modulation frequency. This allows a lower sampling rate to be used during digitization by an analog-to-digital converter (ADC) and during any subsequent digital signal processing.

The fixed-frequency input is set to a frequency 502 on the skirt of the RLC transfer function on either side of the resonant frequency. Placing the input frequency on one side results in relative signatures that are substantially the negative of signatures produced on the other side of the skirt.

As previously discussed, the vehicle signature is typically small compared to the overall envelope of the signal. Therefore, it is desirable to amplify the envelope. This generally requires the subtraction of a DC offset to keep the amplified signal within bounds. As the baseline of the envelope depends on the wire-loop from which it was obtained, it is useful to automatically adjust the DC offset. The DC offset is adjusted using a digital-to-analog converter (DAC). One method for adjusting the DC offset uses pulse width modulation (PWM). One possible implementation of PWM involves adjusting the duty cycle of a square wave and sending it through a low-pass filter to produce the adjustable DC offset. Those skilled in the art will recognize other modulation techniques and methods for adjusting the DC offset without departing from the scope and spirit of the present invention. By setting the frequency of the square wave at the "null" of a subsequent low-pass filter, the ripple in the offset is attenuated (synchronous ripple). In the illustrated embodiment, the ADC includes the capability to apply the desired low-pass filter. In one embodiment, the low-pass filter is a moving average low-pass filter.

Inductance measurement circuits are susceptible to two types of noise. One is common-mode noise and the other is differential noise, both of which are induced in the wire-loop from ambient sources, such as high voltage lines. The present invention incorporates a number of noise rejection features, which improves the overall performance and efficiency of the detector circuit. By design, the detector circuit of the present invention is double-ended and balanced. Because the signal of interest is differential, subtracting the signal of one leg of the detector circuit from the signal of the other leg rejects common-mode noise. The optional coupling transformer rejects common-mode signals from the wire-loop. In addition, the differential input of the ADC provides another opportunity for common-mode rejection.

Those skilled in the art will recognize that a single-ended detector circuit would still be operational; however, all of the common-mode noise would instead appear as differential noise and there would be no opportunity for common-mode rejection inside of the band of interest.

Connecting the synchronous demodulator to the output of the RLC circuit causes all signals outside of the band of interest to be modulated to high frequencies, while the band of interest is demodulated to baseband. The low-pass filter is subsequently used to reject any differential signals outside of the band. In the illustrated embodiment, the analog low-pass RC filters, together with the non-inverting feedback amplifiers provide second-order rejection of out-of-band signals and an anti-aliasing function for the subsequent analog-to-digital conversion. The delta-sigma ADC performs higher-order digital low-pass filtering on the signal as well.

The synchronous demodulator of the present invention takes advantage of the differential output from the RLC circuit. Because the output on one leg of the RLC circuit is 180 degrees out of phase with the output on the other leg, switching between the two legs using the switches of the synchronous demodulator is similar to inverting the output signal of the RLC circuit at every other half cycle of the demodulator frequency. This maintains single-supply operation and does not require a multiplication or inversion operation. Overall, this method modulates differential signals while passing common-mode signals. Differential signals outside of the frequency band of interest are rejected while all differential signals inside of the frequency band of interest are kept. The frequency band of interest is selected to be a band that contains a minimum of unwanted signals, for example power line interference, or a band that contains signals that are controllable, such as crosstalk between loop sensors.

Figure 6:
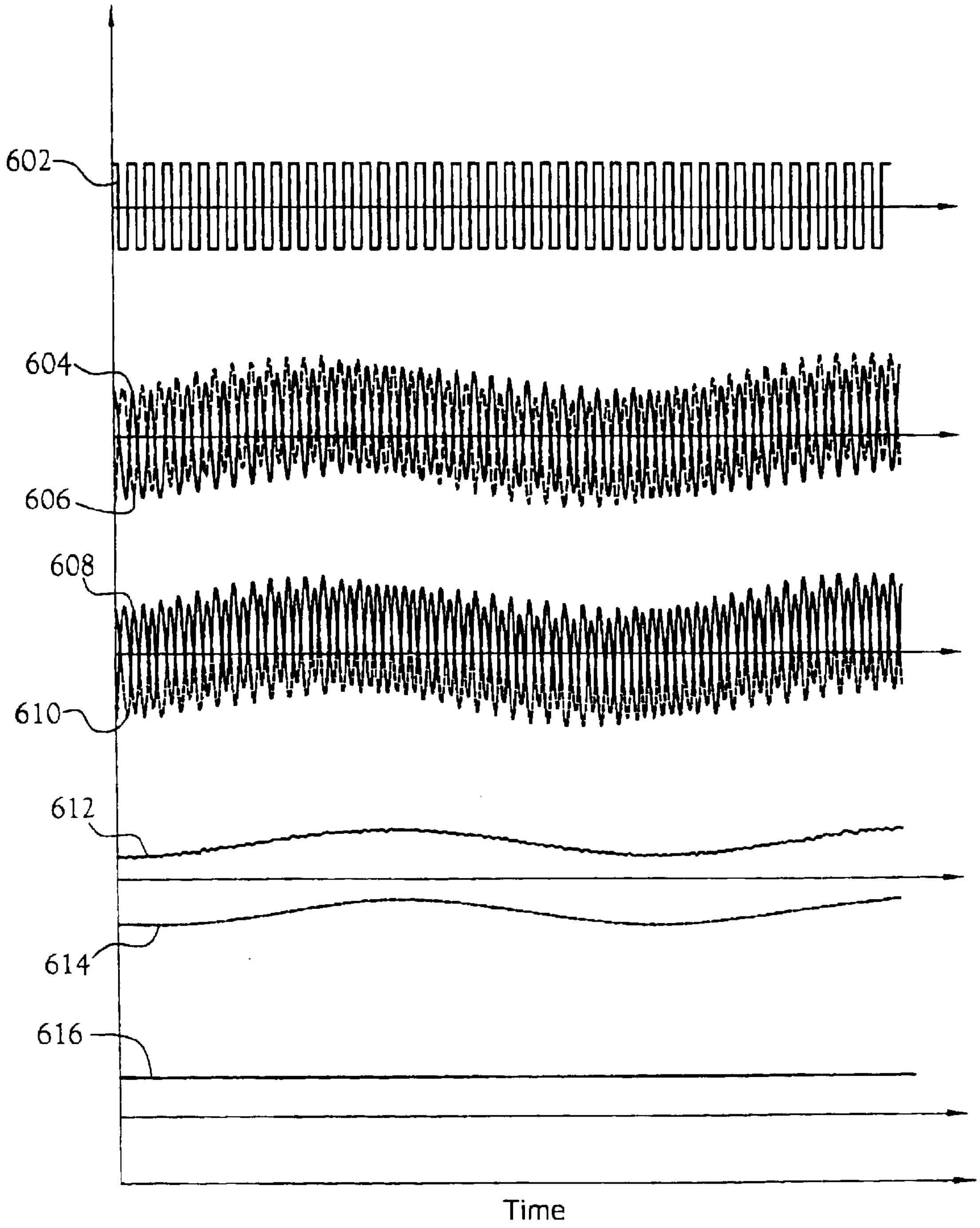
FIG. 6 is a graph of the signal viewed at various points within the detector circuit of FIG. 2.

FIG. 6 shows an example of the various stages in the demodulation/noise cancellation process. Plot 602 represents the driving periodic waveform chosen to be a square wave. Next is illustrated an exemplary output from the RLC circuit including any common-mode and differential noise. The solid line 604 is the output from one leg of the circuit and the dashed line 606 is the output from the other leg. The next plot illustrates the output from the synchronous demodulator with the solid line 608 and the dashed line 610 representing the demodulated outputs from each leg of the RLC circuit. Next is illustrated the signals 612, 614 representing the output from each leg after low-pass filtering in which the differential noise is removed and the common-mode noise remains. The final plot shows the result 616 after the output from one leg is subtracted from the output of the other leg to remove the common-mode noise.

Additionally, adjusting the voltage reference of the ADC rejects on-board noise. A signal generator 220 is connected to the voltage reference of the ADC 218. The output of the signal generator 220 is selected to match a characteristic of the on-board noise.

Figure 7:
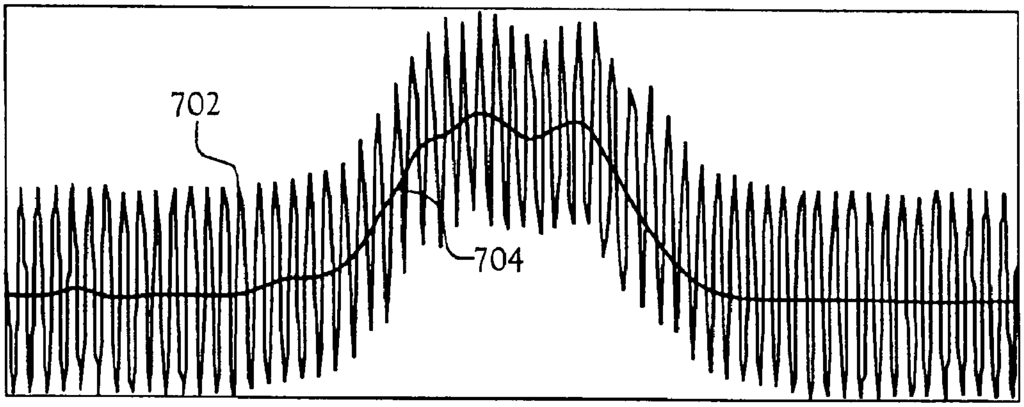
FIG. 7 illustrates a demodulated motorcycle signature obtained using the detector circuit of the present invention.

Another noise signal that an inductive wire-loop is susceptible to is crosstalk. When several inductive wire-loop sensors are in close proximity to one another, their electromagnetic fields couple and their signals interact. Without some control over the signals, it is difficult to distinguish the crosstalk of the wire-loops from the vehicle signatures. The crosstalk usually ends up in the form of a beat frequency in the time domain. It is possible for the amplitude of the beat to be as large as or larger than the amplitude of a vehicle signature. FIG. 7 shows a demodulated motorcycle signature with crosstalk 702 and the signature 704 after the crosstalk is removed.

Figure 8:
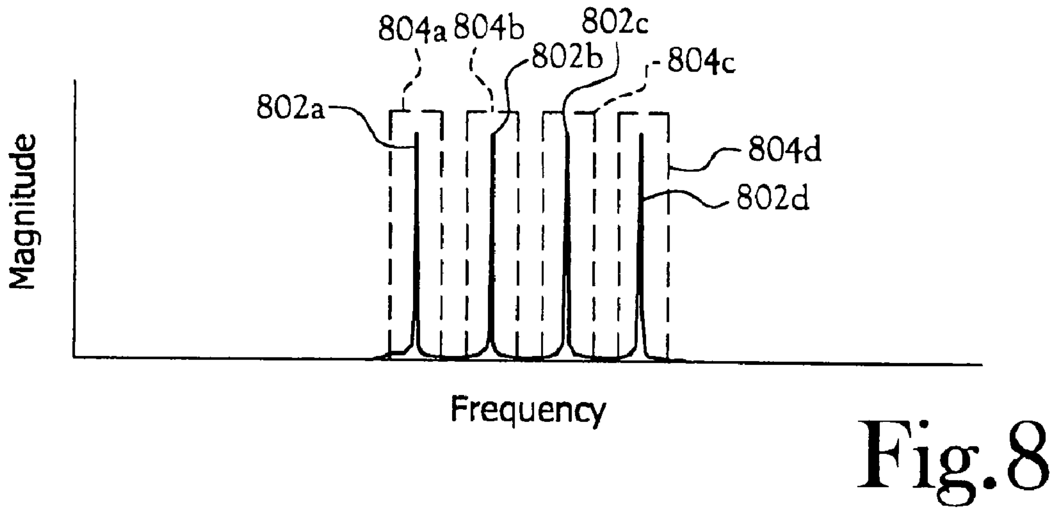
FIG. 8 illustrates an example of the unique frequency bands and carrier frequencies obtained by detector circuits with wire-loop sensors in close proximity to one another.

By controlling the frequency of the excitation sources of two or more cross-talking wire-loops to a high precision and with a modicum of coordination, the beat frequency caused by crosstalk between the wire-loops is controlled. Each detector circuit is provided with a unique carrier frequency 802 and distinct frequency band 804 to operate within as illustrated in FIG. 8. The carrier frequencies need to be spaced far enough apart in order to give enough bandwidth for the signature's signal. The exact amount of separation between carrier frequencies depends on the number of detector circuits operating in close proximity. However, a typical separation range is approximately 50 to 1200 Hertz. The bandwidth required for a signature is mainly a function of vehicle speed, vehicle features and loop geometry. The carrier frequency 802 and the band 804 are selectable within the range of allowable frequencies. Those skilled in the art will recognize the carrier frequency and the band can be manually selectable or can be selected automatically by control logic in the detector circuit that scans for available frequencies upon installation. The limitation on the number of available frequencies is a function of the bandwidth and the separation between bands.

Figure 9:
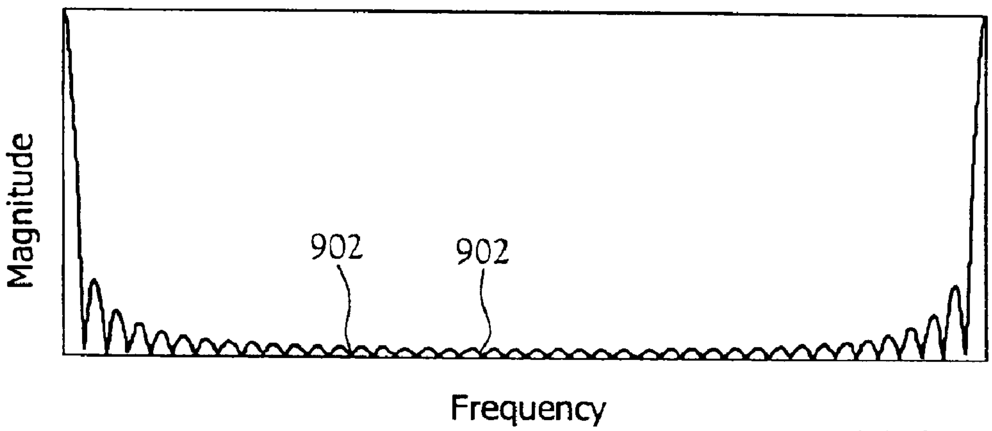
FIG. 9 illustrates the frequency response of a moving average filter.

For physically adjacent loops, when the driving signals are spaced properly and the signal is demodulated to baseband, the crosstalk signals within the band of interest wind up at high frequencies. Accordingly, a low-pass filter can discard the crosstalk and preserve the signature. Those skilled in the art will recognize that the low-pass filter can be performed by an analog circuit or with digital signal processing. In the illustrated embodiment, a digital filter takes a moving average of the signature to "null-out" the beat frequencies. The low-pass filter effectively removes crosstalk when all of the loop driving periods are separated by multiples of the width of the low-pass filter. FIG. 9 shows the frequency response of a moving average filter. The "nulls" 902 appear at frequencies that are multiples of the inverse of the filter width. The window size for the moving average filter is selected to be substantially equal to the period of the periodic noise. Where it is desired to filter out multiple periodic noise sources, the window size is selected to be the least common multiple of the periods.

As previously indicated, an operator could manually set the operating bands for closely spaced loops. However, this job is tedious and difficult to perform correctly. A more efficient approach is to automatically search for and select an operating channel for the detector circuit.

In order to automatically select an operating channel for the detector circuits it is necessary to determine the frequencies at which other proximate detector circuits are operating. This is difficult if there is no communication between detector circuits. One way to determine where the other detector circuits are located in the frequency spectrum is to scan through a number of demodulation frequencies using the synchronous demodulator. Without any driving signal on the RLC circuit, the detector circuit can passively listen for signals at various frequency bands. The detector circuit uses that information to determine whether another detector circuit is already operating at a desired frequency, without interfering with such detectors in the process.

An additional constraint on the selection of a channel is the impedance of the wire-loop sensor. In order for slope detection to function accurately, the driving frequency should be on the skirt of the transfer function of the RLC circuit. The location of the skirt is based on the resonant frequency and Q-factor of the RLC circuit. One method for identifying a proper resonant frequency is to have the detector circuit actively scan through a number of driving frequencies and measure the resulting responses. Typically, upon power-up, the detector circuit automatically drives the attached wire-loop sensor through a range of frequencies and builds a frequency response curve for the resulting RLC circuit. The mean of the response is the approximate magnitude of the transfer function, while the standard deviation indicates the strength of the signal in that band. The frequency curve is analyzed to determine the useful frequency range for locating the resonant frequency. By comparing the available frequencies identified during the passive scan with the desired range of frequencies identified during the active scan for the resonant frequency, the best available channel is selected. Those skilled in the art will recognize that automatic channel selection is best performed while a vehicle is not present; however, if the channel selection process is interrupted by the passage of a vehicle, the steps of the selection process can be repeated.

Inductive loops that are in close proximity to each other are magnetically coupled. One consequence of this coupling is that if one loop is driven by a time-varying voltage causing a time-varying current to flow, part of the magnetic field created by that current will intersect the other loop causing a time-varying current to flow in the other loop. This is a mechanism by which information can be transmitted by one loop and received by another, without requiring the detector circuits to be otherwise physically linked.

One modulation scheme used to transmit binary data is "binary phase-shift keying". In this modulation scheme, a binary "1" is transmitted by a sinusoidal current variation at some predetermined frequency. Then a binary "0" is indicated by suddenly inverting the polarity of the sinusoidal current. This polarity inversion is equivalent to a sudden change of phase of 180°.

Figure 10:
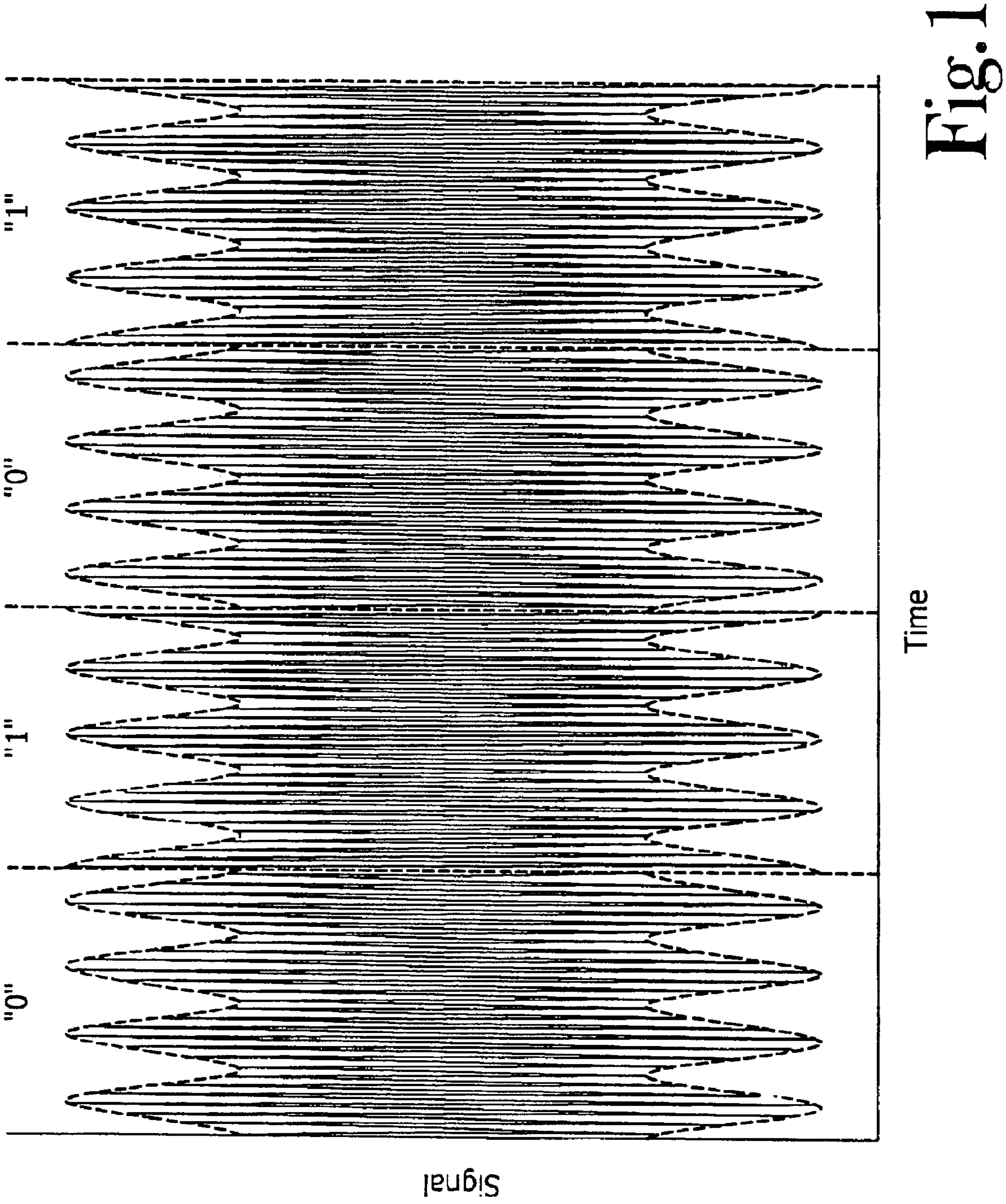
FIG. 10 shows the modulated beat on an output signal of the RLC circuit from a receiving detector, which is used for interloop communication.

The signal created in the receiving loop by the magnetic coupling and the driving signal of the receiving loop that is used to detect vehicle signatures are added. If the frequency of the communication signal generated by the transmitting loop is different from the frequency of the receiving loop's own driving voltage and if the bandwidth of the data transmission is low enough, when the two signals are added in the receiving loop, they can be later separated by a processor employing signal processing techniques, and both loops can detect vehicle signatures while simultaneously sending and receiving data. FIG. 10 shows the output signal of the RLC circuit of a receiving detector. The output signal contains a beat that is modulated with a binary phase-shift keyed signal.

One way to generate a precision oscillator uses an accurate square wave oscillator in conjunction with a digital difference analyzer (DDA) commonly used for drawing lines on computer displays. A crystal-based oscillator is one implementation that produces acceptable results; however, those skilled in the art will recognize other methods of generating an accurate square wave that are also effective. The DDA makes small adjustments in the zero crossings of the oscillation to provide the desired oscillation frequency. This gives more possible frequencies than simply dividing the reference clock by an integer. The result of this technique is to have the reference clock effectively multiplied by a rational number.

Here is a pseudo code implementation of the algorithm:

```
// The output rate is essentially clock*numerator/denominator
// total, numerator, and denominator are integers.
total = 0;
for( each clock )
    if( total>=0 )
        total = total - numerator;
    else
    {
        total = total + denominator - numerator;
        out = !out; // Toggle the output.
    }
```

This approach yields square waves that may not have a duty cycle of 50%.

Another implementation of the demodulator circuit uses an envelope detector in the form of a full-wave bridge rectifier (FWBR) in place of the synchronous demodulator previously discussed. FIG. 11 shows a differential implementation of the FWBR circuit.

The inputs of the FWBR are driven by the outputs of the RLC circuit. In theory, the components are assumed to be ideal and, therefore, the RLC circuit is balanced producing equal and opposite inputs to the FWBR. Those skilled in the art will recognize that actual components are not ideal and the RLC circuit will be unbalanced as a result of variations in the components. Further, the manual selection of matching components is neither cost effective nor an efficient use of time and is impracticable for mass production. The result of an unbalanced RLC circuit is a non-symmetric input to the FWBR that produces an unwanted differential signal. Consider the case where $R_1$ and $R_2$ are not identical. The result is noise on the order of 20–40 dB, which effectively consumes approximately seven bits of resolution. However, by modulating the value of the resistors by intermittently placing the driving signal in a high-impedance state, the apparent value of resistors is matched to a sufficient level to improve the balance of the circuit, and reduce or eliminate the unwanted differential noise.

Similarly, when capacitors $C_1$ and $C_2$ are not sufficiently matched, the RLC circuit is unbalanced. Even assuming the capacitors match initially, the values of the capacitors will drift due to the environment, and as a function of age. One method for modulating the effective value of a capacitor is to vary the temperature of the capacitor. By placing a heating element close to a capacitor, the temperature of the capacitor can be regulated. In the one embodiment, the heating element is a resistor in conjunction with a variable current source. The resistor is thermally coupled to the capacitor and the coupled capacitor and resistor are optionally insulated for optimal thermal efficiency. The variable current source can regulate temperature by applying a variable duty cycle signal or the duty cycle can remain constant while the voltage applied to the resistor varies. Those skilled in the art will recognize that the heating element can be configured as necessary to achieve the desired level of thermal trimming for the RLC circuit without departing from the scope and spirit of the present invention. This includes, but is not limited to, varying the thermal coupling or the insulation.

Figure 12:
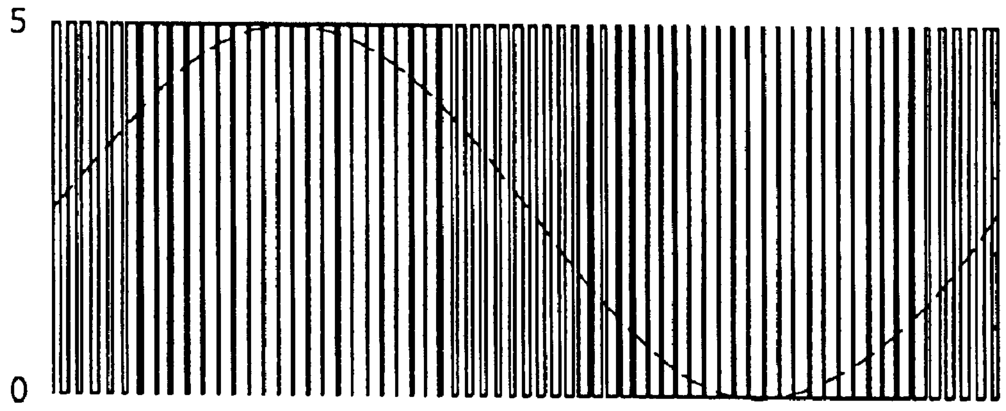
FIG. 12 illustrates one cycle of a pulse-width modulated drive voltage with the ideal sinusoid superimposed as a dashed line.

The tri-state buffers 206*a*, 206*b*, which drive the loop, can only switch between two voltage levels, normally +5 volts and 0 volts. Therefore, the tri-state buffers cannot drive the loop with a true sinusoid. However, by switching the tri-state buffers 206*a*, 206*b* at a high rate compared with the desired sinusoidal frequency and by controlling the duty cycle of the switched voltage thus applied, the effect of the applied voltage can be made very nearly the same as if a sinusoid were actually applied. This technique is called "pulse-width modulation" (PWM) or "duty-cycle modulation". FIG. 12 illustrates one cycle of an actual PWM drive voltage with the ideal sinusoid superimposed as a dashed line.

Although the two signals look quite different, the average value of the PWM signals over one switching period and the average value of the sinusoid over the same period are identical. Therefore, if the PWM signal were applied to a low-pass filter whose cutoff frequency is below the switching frequency, the output of the filter is a very good approximation of a sinusoid. In other words, the PWM signal is a sinusoid with higher harmonics added. Most of the higher harmonic signal power is at frequencies at or above the switching rate, which in the illustrated waveform is 64 times the sinusoidal frequency.

If the PWM signal is applied to the inductive loop instead of a true sinusoid, the current that flows is substantially the same current that would have flowed if the sinusoid had been applied, plus some extra harmonic currents at high frequencies. The synchronous demodulator has a low-pass filter on its output, which almost totally eliminates the effects of the high-frequency harmonics, yielding effectively the same demodulated signal that would have been obtained had the loop been driven with a true sinusoid.

The impedance of the inductive loop at any frequency is the ratio of the applied sinusoidal voltage at that frequency to the sinusoidal current that flows in response. Since the voltage and current can, in general, be out of phase, this ratio is a complex number with a magnitude and phase, both of which are functions of frequency. The synchronous demodulator is typically operated in a manner to obtain either the component of the signal that is in phase with the driving sinusoid or to obtain the component of the signal that is in "quadrature" (90° out of phase) with the driving sinusoid. Together, these two demodulated signals determine the magnitude and phase of the signal.

The in-phase and quadrature synchronous demodulator outputs together with the knowledge of the capacitor values, C1 and C2, is enough information to determine the inductive loop impedance at the frequency of the sinusoid applied. The variation of impedance with frequency is then found by repeating the process at different frequencies.

While a preferred embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention, we claim:

1. An inductance measurement circuit for measuring an inductance of a wire-loop, said inductance measurement circuit comprising:

a pair of driver circuits in electrical communication with a wire-loop;

a demodulation circuit in electrical communication with said pair of driver circuits, said demodulation circuit producing a demodulated signal; and means for converting an analog signal into a digital signal in electrical communication with said pair of driver circuits, said means for converting an analog signal into a digital signal producing a digitized signal representing an inductance measured of the wire-loop.

2. The inductance measurement circuit of claim 1 further comprising an amplifier circuit in electrical communication between said demodulation circuit and said means for converting an analog signal into a digital signal, said amplifier producing an amplified signal.

3. The inductance measurement circuit of claim 1 further comprising a pre-amplifier circuit in electrical communication between said pair of driver circuits and said demodulation circuit.

4. The inductance measurement circuit of claim 1 wherein said pair of driver circuits operate at a fixed-frequency.

5. The inductance measurement circuit of claim 1 wherein said demodulation circuit includes a demodulation oscillator, said demodulation circuit producing an output derived from said pair of driver circuits and said demodulation oscillator.

6. The inductance measurement circuit of claim 5 wherein said output is a demodulated signal substantially corresponding to an envelope of the combined RLC waveform.

7. The inductance measurement circuit of claim 1 further comprising a filter which removes noise substantially outside a selected frequency range of the inductance measurement circuit, said filter in communication between said demodulation circuit and said means for converting an analog signal into a digital signal.

8. The inductance measurement circuit of claim 1 wherein said demodulation circuit is a synchronous demodulator.

9. The inductance measurement circuit of claim 8 wherein said synchronous demodulator includes a plurality of analog switches.

10. The inductance measurement circuit of claim 8 wherein said demodulation circuit and said pair of driver circuits operate at substantially the same frequency.

11. The inductance measurement circuit of claim 1 further comprising a dc voltage offset generator for producing a dc offset voltage and a signal conditioning circuit in electrical communication between said demodulation circuit and said dc voltage offset generator, said signal conditioning circuit removing said dc voltage from said demodulated signal thereby allowing said demodulated signal to be amplified without saturating.

12. The inductance measurement circuit of claim 1 wherein said pair of driver circuits include a pair of resistance-capacitance networks, each of said pair of resistance-capacitance networks driven by a multi-state buffer, each of said pair of resistance-capacitance networks having a resistance.

13. The inductance measurement circuit of claim 12 wherein each of said pair of resistance-capacitance networks has a large apparent impedance.

14. The inductance measurement circuit of claim 12 wherein each of said pair of resistance-capacitance networks is balanced using said multi-state buffer to modulate said resistance.

15. The inductance measurement circuit of claim 12 wherein said multi-state buffer is driven at a high rate compared to a desired sinusoidal frequency by a duty cycle controlled voltage.

16. The inductance measurement circuit of claim 1 wherein the wire-loop is directly coupled to said pair of driver circuits.

17. The inductance measurement circuit of claim 1 further comprising a transformer coupling the wire-loop to said pair of driver circuits, said transformer rejecting a common-mode noise originating from the wire-loop.

18. The inductance measurement circuit of claim 1 wherein said means for converting an analog signal into a digital signal is a delta-sigma analog-to-digital converter.

19. The inductance measurement circuit of claim 1 wherein said pair of driver circuits is driven by a differential, periodic waveform.

20. The inductance measurement circuit of claim 19 wherein said periodic waveform is a sine wave.

21. The inductance measurement circuit of claim 19 wherein said periodic waveform is substantially a square wave, said square wave having a frequency substantially similar to an operating frequency of said pair of driver circuits.

22. The inductance measurement circuit of claim 1 wherein said dc offset generator includes a digital-to-analog converter.

23. The inductance measurement circuit of claim 1 wherein said dc offset generator uses pulse width modulation to adjust a duty cycle of a square wave.

24. The inductance measurement circuit of claim 1 wherein said means for converting an analog signal into a digital signal includes a voltage reference input, said inductance measurement circuit further comprising a signal generator connected to said voltage reference input, an output of said signal generator selected to match a characteristic of internal noise in said inductance measurement circuit.

25. The inductance measurement circuit of claim 1 wherein a plurality of said inductance measurement circuits are operating in close proximity, each of said plurality of said inductance measurement circuits operating at a unique carrier frequency and in a distinct frequency band from other closely proximate said inductance measurement circuits.

26. The inductance measurement circuit of claim 25 wherein each said carrier frequency is separated from each said carrier frequency of a proximate said inductive measurement circuit to provide sufficient bandwidth for operation.

27. The inductance measurement circuit of claim 25 wherein each said carrier frequency is separated from each other said carrier frequency by between approximately 50 to approximately 1200 Hertz.

28. The inductance measurement circuit of claim 1 wherein said demodulation circuit is a full-wave bridge rectifier.

29. The inductance measurement circuit of claim 1 further comprising a heating element in close proximity to a capacitor of said pair of driver circuits.

30. The inductance measurement circuit of claim 29 wherein said heating element is thermally coupled to said capacitor.

31. The inductance measurement circuit of claim 29 wherein said heating element is a resistor connected to a variable current source.

32. The inductance measurement circuit of claim 31 wherein said resistor and said capacitor are thermally insulated to improve thermal efficiency.

33. The inductance measurement circuit of claim 1 wherein said means for converting an analog signal into a digital signal includes a low-pass filter.

34. The inductance measurement circuit of claim 1 wherein said means for converting an analog signal into a digital signal includes differential inputs and rejects a common-mode noise applied to said inductance measurement circuit by the wire-loop.

35. The inductance measurement circuit of claim 1 wherein a characteristic of at least one said pair of driver circuits is modulated to balance said pair of driver circuits for common-mode noise rejection.

36. An inductance measurement circuit for measuring an inductance of a wire-loop, said inductance measurement circuit comprising:

a pair of driver circuits in electrical communication with a wire-loop;

a demodulation circuit in electrical communication with said pair of driver circuits, said demodulation circuit producing a demodulated signal;

a filter in electrical communication with said demodulation circuit, said filter producing a filtered signal; and an analog-to-digital converter converting an analog signal into a digital signal in electrical communication with said filter, said analog-to-digital converter producing a digitized signal representing an inductance measured of the wire-loop.

37. An inductance measurement circuit for measuring an inductance of a wire-loop, said inductance measurement circuit comprising:

a pair of driver circuits in electrical communication with a wire-loop;

a demodulation circuit in electrical communication with said pair of driver circuits, said demodulation circuit producing a demodulated signal; and an analog-to-digital converter converting an analog signal into a digital signal in electrical communication with said demodulation circuit, said analog-to-digital converter producing a digitized signal representing an inductance measured of the wire-loop.

* * * * *